US009672902B1

(12) United States Patent
Sinangil et al.

(10) Patent No.: US 9,672,902 B1
(45) Date of Patent: Jun. 6, 2017

(54) BIT-CELL VOLTAGE CONTROL SYSTEM

(71) Applicant: Apple Inc., Cupertino, CA (US)

(72) Inventors: Yildiz Sinangil, Sunnyvale, CA (US); Mohamed H. Abu-Rahma, Mountain View, CA (US); Jaroslav Raszka, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/227,669

(22) Filed: Aug. 3, 2016

(51) Int. Cl.
G11C 11/41 (2006.01)
G11C 11/419 (2006.01)

(52) U.S. Cl.
CPC .................... G11C 11/419 (2013.01)

(58) Field of Classification Search
CPC .................................................. G11C 11/419
See application file for complete search history.

(56) References Cited

U.S. PATENT DOCUMENTS

| 6,031,778 A * | 2/2000 | Makino ............. G11C 7/00 327/530 |
| 6,341,087 B1 * | 1/2002 | Kunikiyo ............. G11C 11/412 365/189.09 |
| 6,611,451 B1 * | 8/2003 | Houston ............. G11C 11/418 365/154 |
| 7,596,013 B2 | 9/2009 | Yamaoka et al. |
| 2006/0002177 A1 * | 1/2006 | Zheng ............. G11C 11/417 365/154 |
| 2006/0274569 A1 * | 12/2006 | Joshi ............. H01L 27/1104 365/154 |
| 2008/0144365 A1 * | 6/2008 | Yamaoka ............. G11C 11/417 365/181 |
| 2009/0080276 A1 | 3/2009 | Cai et al. |
| 2009/0213641 A1 | 8/2009 | Park et al. |
| 2010/0109764 A1 * | 5/2010 | Dathe ............. G11C 5/147 327/544 |

OTHER PUBLICATIONS

Daeyeon Kim, et al., "A 1.85fW/bit Ultra Low Leakage 10T SRAM with Speed Compensation Scheme," 2011 IEEE International Symposium of Circuits and Systems (ISCAS), May 15-18, 2011, pp. 69-72.
Zhengya Zhang and Zheng Guo, "Active Leakage Control with Sleep Transistors and Body Bias," Symposium on Low Power Electronics and Design, 2005, 6 pages.

(Continued)

*Primary Examiner* — Khamdan Alrobaie
(74) *Attorney, Agent, or Firm* — Meyertons, Hood, Kivlin, Kowert & Goetzel, P.C.

(57) ABSTRACT

In some embodiments, a system includes a bit-cell circuit and a body voltage control circuit. During a sleep mode, the bit-cell circuit receives, via a source node of a transistor, a retention voltage. During an active mode, the bit-cell receives, via the source node, an operating voltage. The body voltage control circuit includes a first transistor that connects a body node of the transistor of the bit-cell circuit to the source node such that during the sleep mode, the body node receives the retention voltage. The body voltage control circuit further includes a second transistor that connects the body node to a voltage source such that during the active mode, the body node receives the operating voltage.

20 Claims, 5 Drawing Sheets

(56) References Cited

OTHER PUBLICATIONS

Rahul M. Rao, et al., "Analysis and Mitigation of CMOS Gate Leakage," 2008, Research Gate, retrieved Apr. 21, 2016, 7 pages.
Steven M. Martin, et al., "Combined Dynamic Voltage Scaling and Adaptive Body Biasing for Lower Power Microprocessors under Dynamic Workloads," IEEE/ACM International Conference on Computer Aided Design, ICCAD 2002, pp. 721-725.
Daeyeon Kim, "Design and Analysis of Robust Low Voltage Static Random Access Memories," A dissertation submitted in partial fullfillment of the requirements for the degree of Doctor of Philosophy (Electrical Engineering) in the University of Michigan, 2012, 138 pages.
Nam Sung Kim, et al., "Drowsy Instruction Caches, Leakage Power Reduction using Dynamic Voltage Scaling and Cache Sub-bank Prediction," Proceedings. 35th Annual IEEE/ACM International Symposium on Microarchitecture, 2002, pp. 219-230.
Andrea Manuzzato, et al., "Exploiting Body Biasing for Leakage Reduction: A Case Study," 2013 IEEE Computer Society Annual Symposium on VLSI, pp. 133-138.
Radu Teodorescu, et al., "Mitigating Parameter Variation with Dynamic Fine-Grain Body Biasing*," 40th Annual IEEE/ACM International Symposium on Microarchitecture, Dec. 1-5, 2007, pp. 27-42.
Ali Keshavarzi, et al., "Technology Scaling Behavior of Optimum Reverse Body Bias for Standby Leakage Power Reduction in CMOS IC's," ACM, 1999, pp. 252-254.
Mohamed H. Abu-Rahma, et al., "BIT-Cell Voltage Distribution System," U.S. Appl. No. 15/046,329, filed Feb. 17, 2016, 29 pages.

\* cited by examiner

BIT-CELL VOLTAGE CONTROL SYSTEM

BACKGROUND

Technical Field

This disclosure relates generally to a bit-cell voltage control system.

Description of the Related Art

Power consumption by electronic devices has been a growing concern for some time. With the proliferation of mobile devices like mobile phones, tablets, computers and the like, reducing power consumption has become a key design metric. As such, designers are constantly looking for ways to reduce the amount of power consumed by the devices they develop.

There are many ways to reduce power consumption of a device. One mechanism to reduce power consumption is referred to as power gating in which the supply voltage provided to a device or a portion of a device is reduced or removed when that device or portion is in a particular mode, such as a sleep mode or a shutdown mode. Another mechanism is referred to as clock gating in which one or more clock signals that are provided to a device or a portion of a device are stopped when that device or portion is not being used. The stopped clock reduces the device transistor transitions, and thus reduces the power consumed. In some cases, combinations of power and clock gating may be used for even greater reductions.

While these power reduction mechanisms work well, there can be drawbacks. For example, although power gating may reduce sub threshold leakage of components of the device, power gating may have less of an effect on junction leakage of components of the device.

SUMMARY

In various embodiments, a bit-cell voltage control system is disclosed where, when a bit-cell circuit is in various modes, a body voltage control circuit connects one or more body nodes of one or more transistors of the bit-cell circuit to one or more source nodes of the one or more transistors. For example, the body voltage control circuit may connect the one or more body nodes to the one or more source nodes when the bit-cell circuit is in a sleep mode or a shutdown mode. As a result, a voltage (e.g., a retention voltage or a shutdown voltage) provided to the one or more source nodes is similarly provided to the one or more body nodes. Because the one or more source nodes and the one or more body nodes both receive the same voltage, a junction leakage between the one or more source nodes and the one or more body nodes is reduced, as compared to a system where the one or more source nodes receive the voltage and the one or more body nodes receive an operating voltage.

In various embodiments, when the bit-cell circuit is in various other modes, the body voltage control circuit connects the one or more body nodes to an operating voltage. For example, the body voltage control circuit may connect the one or more body nodes to the operating voltage when the bit-cell circuit is in an active mode or a standby mode. As a result, dynamic power consumption of the bit-cell may be reduced, as compared to a system where the one or more body nodes are directly connected to the one or more source nodes.

Figure 1:
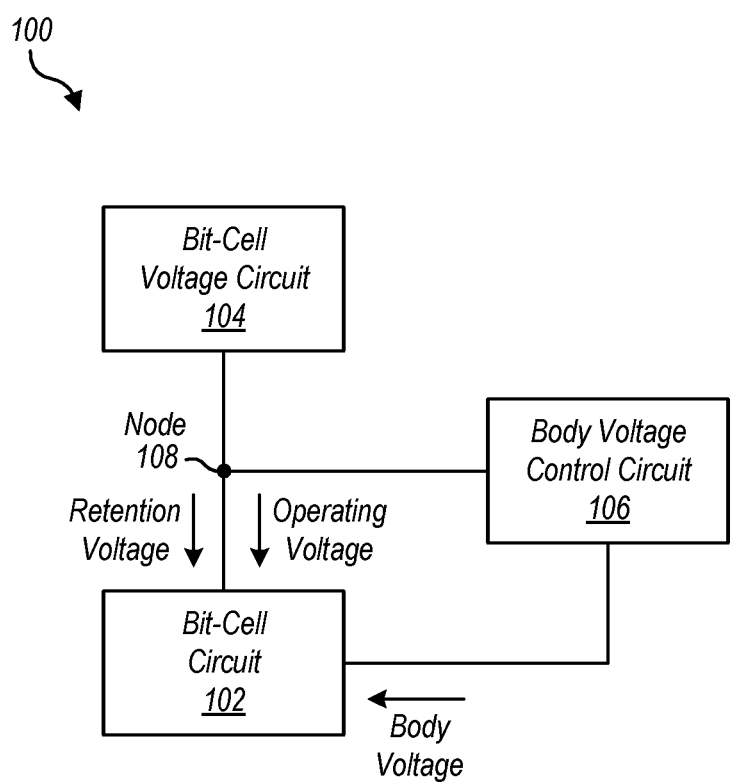
FIG. 1 is a block diagram illustrating one embodiment of an exemplary bit-cell voltage control system.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "bit-cell circuit configured to store a data value" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a bit-cell circuit that includes six transistors, the terms "first transistor" and "second transistor" can be used to refer to any two of the six transistors, and not, for example, just logical transistors 0 and 1.

When used in the claims, the term "or" is used as an inclusive or and not as an exclusive or. For example, the phrase "at least one of x, y, or z" means any one of x, y, and z, as well as any combination thereof (e.g., x and y, but not z).

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION

A bit-cell voltage control system is described herein where a body voltage control circuit controls a voltage provided to one or more body nodes of one or more transistors of a bit-cell circuit based on a mode of the bit-cell circuit. For example, in some embodiments, when the bit-cell circuit is in a sleep mode or a shutdown mode, the body voltage control circuit may connect the one or more body nodes to one or more source nodes of the one or more transistors. When the bit-cell circuit is in an active mode or a standby mode, the body voltage control circuit may connect the one or more body nodes to an operating voltage (e.g., Vdd or Vss). As described further herein, in some embodiments, the voltage at the one or more body nodes may be controlled such that the one or more transistors may be effectively zero body biased in the sleep mode, the shutdown mode, and the active mode. Additionally, the one or more transistors may be reverse body biased in the standby mode. As a result, a junction leakage may be reduced during at least some modes of the bit-cell circuit (e.g., the sleep mode, the shutdown mode, and the active mode), as compared to a system that does not include a body voltage control circuit. Additionally, a dynamic power consumption may be reduced during at least some modes of the bit-cell circuit (e.g., the standby mode), as compared to a system that does not utilize a standby mode.

As used herein, "connect" refers to an electrical connection between two components. However, one or more intervening components may be present as long as a same electrical signal is provided to the two components. For example, two nodes are connected despite an intervening transistor as long as a same voltage is provided to both nodes (via the intervening transistor).

The present disclosure refers to transistors as being "effectively zero body biased." As used herein, the term "effectively zero body biased" means that a source node of a transistor is connected to a body node of the transistor. However, the voltage at the source node may differ from the voltage at the body node due to intervening components, such as resistance due to at least one of intervening transistors, circuit elements, or wires.

This disclosure initially describes, with reference to FIG. 1, various portions of various embodiments of a bit-cell voltage control system. Example processes performed by various embodiments of a bit-cell voltage control system are described with reference to FIGS. 2 and 3. A method performed by an embodiment of a bit-cell voltage control system that controls a body voltage of a bit-cell circuit is described with reference to FIG. 4. Finally, an exemplary computing system that includes a bit-cell voltage control system is described with reference to FIG. 5.

Turning now to FIG. 1, a block diagram of various embodiments of an exemplary bit-cell voltage control system 100 is shown. In the illustrated embodiment, bit-cell voltage control system 100 includes bit-cell circuit 102, bit-cell voltage circuit 104, body voltage control circuit 106, and node 108. In some embodiments, one or more repeaters or other logic may be present between one or more of the illustrated circuits.

As further described with reference to FIG. 3, bit-cell circuit 102 may operate in a variety of modes in which various actions are performed. For example, in some embodiments, bit-cell circuit 102 may operate in at least two of an active mode, a mode where bit-cell circuit 102 is not configured to output a data value, referred to herein as a standby mode, a sleep mode, a shutdown mode, or another mode. Depending on the mode, bit-cell circuit 102 may perform various actions using various voltages at one or more source nodes of one or more transistors of bit-cell circuit 102 and one or more body nodes of the one or more transistors. For example, in some embodiments, when bit-cell circuit 102 is in an active mode, bit-cell circuit may, using an operating voltage, receive a data value, may output a stored data value, or both. Bit-cell circuit 102 may be configured to switch between modes in response to various signals. For example, bit-cell circuit 102 may be configured to switch from the standby mode to the active mode in response to an indication of a read operation at bit-cell circuit 102 or in response to an indication of a write operation at bit-cell circuit 102.

Bit-cell voltage circuit 104 may control (e.g., in response to a wake signal indicative of a mode where the operating voltage is used at bit-cell circuit 102) a voltage at one or more nodes of bit-cell circuit 102 based on a mode of bit-cell circuit 102. Additionally, in some embodiments, bit-cell voltage circuit 104 may provide a voltage to body voltage control circuit 106 via node 108. In the illustrated embodiment, bit-cell voltage circuit 104 may output an operating voltage, a retention voltage, or a shutdown voltage.

Body voltage control circuit 106 may control a body voltage at one or more body nodes of one or more transistors of bit-cell circuit 102 based on a mode of bit-cell circuit 102. In some embodiments, body voltage control circuit 106 may send the operating voltage, the retention voltage, or the shutdown voltage to bit-cell circuit 102 as the body voltage. Body voltage control circuit 106 may provide the operating voltage from a separate voltage source from a voltage source of bit-cell voltage circuit or from the same voltage source. In some embodiments, when bit-cell circuit 102 is in a particular mode (e.g., a sleep mode), body voltage control circuit 106 may provide a body voltage from node 108 to bit-cell circuit 102 such that a source node of a transistor of bit-cell circuit 102 receives a same voltage as a corresponding body node of the transistor. As a result, a junction leakage of the transistor may be reduced, as compared to a system where the body node receives the operating voltage and the source node receives the retention voltage. In some embodiments, body voltage control circuit 106 may provide voltages to a plurality of bit-cell circuits, including bit-cell circuit 102.

Figure 2:
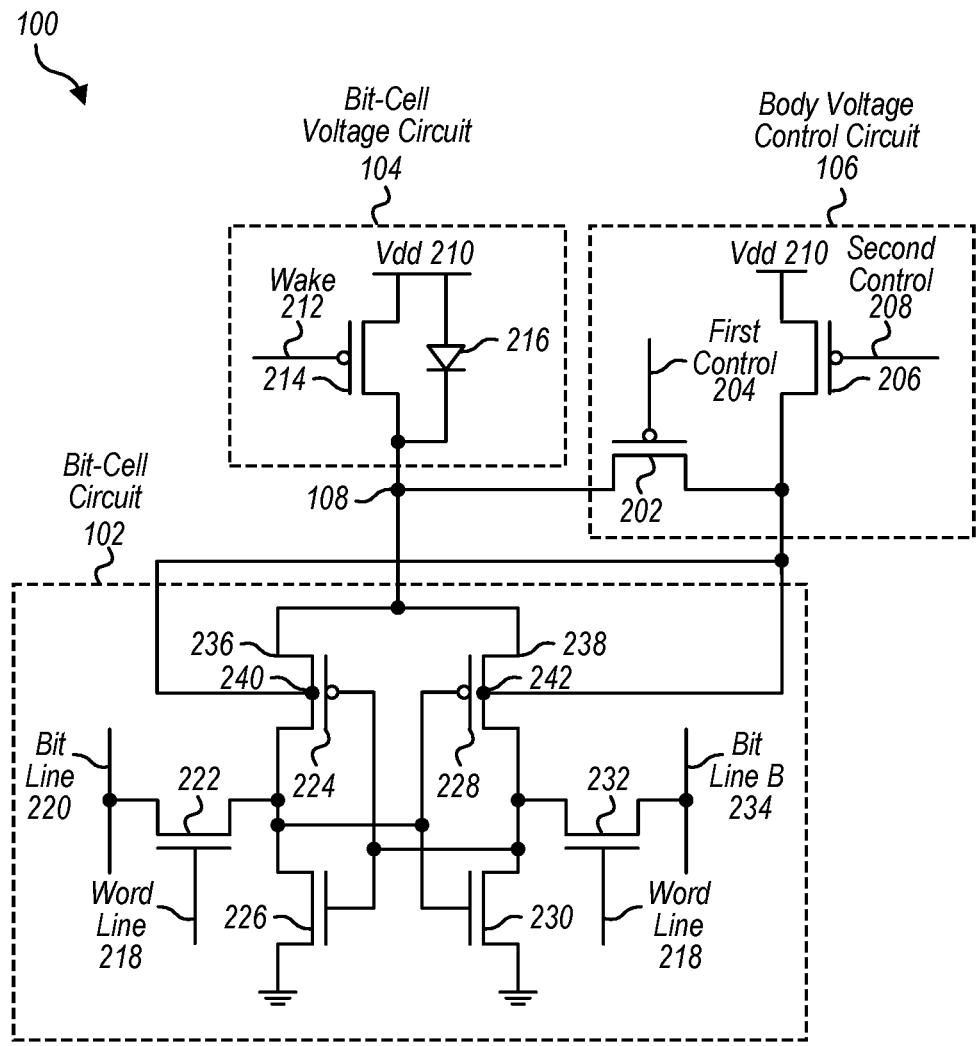
FIG. 2 is a block diagram illustrating components of one embodiment of an exemplary bit-cell voltage control system.

As described above, bit-cell circuit 102 may operate in various modes. FIGS. 2 and 3 together illustrate four exemplary modes: an active mode, a standby mode, a sleep mode, and a shutdown mode. As used herein, these modes correspond to various operations at bit-cell circuit 102. Although these modes are described with respect to voltages being provided to active-low transistors, in some embodiments, voltages having a related relationship may be provided to active-high transistors. The modes are described herein for purposes of illustration and do not preclude bit-cell circuit 102 operating in other modes or in fewer than all of the modes described herein (e.g., not operating in the standby mode). Additionally, in other embodiments, at least some components of the bit-cell voltage control system 100 may receive different voltages.

Bit-cell circuits, such as bit-cell circuit 102, are used to store data in conjunction with read and write operations. As used herein, the active mode refers to a state in which bit-cell circuit 102 is configured to receive one or more data values (e.g., a write operation), to output one or more data values (e.g., a read operation), or both. In other words, in the illustrated embodiments, when a read or write occurs at bit-cell circuit 102, bit-cell circuit 102 is in active mode. However, in other embodiments, multiple active modes (e.g., one active mode for read operations and one active mode for write operations) are contemplated. Bit-cell circuit 102 may require at least a particular voltage to correctly perform read operations, write operations, or both. Accordingly, when bit-cell circuit 102 is in the active mode, bit-cell circuit 102 may receive an operating voltage at one or more source nodes of one or more transistors and at one or more body nodes of the one or more transistors.

As noted above, bit-cell circuit 102 may require at least the particular voltage to receive one or more data values, to output one or more data values, or both. However, the particular voltage may exceed a voltage required to preserve a data value at bit-cell circuit 102. Accordingly, it may be desirable for bit-cell circuit 102 to enter a mode that consumes less power than the active mode but where bit-cell circuit 102 is still capable of preserving a data value. Further, as noted above, junction leakage may represent a significant percentage of power consumption of bit-cell circuit 102. In some embodiments disclosed herein, bit-cell circuit 102 may enter a sleep mode that operates using a reduced source voltage at one or more transistors, as compared to the active mode. As used herein, the sleep mode refers to a state where one or more source nodes of one or more transistors of bit-cell circuit 102 are connected to one or more body nodes of the one or more transistors of bit-cell circuit and where a reduced voltage, as compared to an operating voltage used in the active mode, is received at the one or more source nodes and the one or more body nodes. In the embodiments described herein, the reduced voltage is sufficient to preserve a data value at bit-cell circuit 102. Further, because the one or more source nodes are connected to the one or more body nodes, a junction leakage between the one or more source nodes and the one or more body nodes may be reduced. As a result, when in the sleep mode, bit-cell circuit 102 preserves a data value (if present). Additionally, in the illustrated embodiment, bit-cell circuit 102 consumes less power, as compared to the active mode.

As noted above, it may be desirable for bit-cell circuit 102 to enter a mode that consumes less power than the active mode. However, an amount of time required for bit-cell circuit 102 to transition from the sleep mode to the active mode may be undesirably high. As a result, memory accesses to bit-cell circuit 102 may take an undesirable amount of time when bit-cell circuit 102 is in the sleep mode. Accordingly, it may be desirable for bit-cell circuit 102 to enter a standby mode that consumes less power (e.g., less leakage power) than the active mode, consumes more power than the sleep mode, can transition into the active mode more quickly than the sleep mode, and can preserve a data value. As used herein, the standby mode refers to a state where one or more body nodes of one or more transistors of bit-cell circuit 102 receive the operating voltage and one or more source nodes of the one or more transistors receives a reduced voltage, as compared to the operating voltage. As a result, in the illustrated embodiment, when in the standby mode, bit-cell circuit 102 preserves a data value (if present). Additionally, in the illustrated embodiment, because the operating voltage is received at one or more body nodes of the one or more transistors, bit-cell circuit 102 is able to transition from the standby mode into the active mode more quickly, as compared to transitioning from the sleep mode to the standby mode. For example, bit-cell circuit 102 may be able to transition from the sleep mode to the active mode in 5-50 clock cycles. On the other hand, bit-cell circuit 102 may be able to transition from the standby mode to the active mode in 1-4 clock cycles or in less than one clock cycle. In many embodiments, the standby mode consumes more power than the sleep mode but less power than the active mode.

In some cases, a system including the bit-cell circuit 102 may be active, but bit-cell circuit 102 may not be used to store data values. Accordingly, it may be desirable for bit-cell circuit 102 to enter a shutdown mode where bit-cell circuit 102 consumes less power than the sleep mode and where bit-cell circuit 102 is not expected to preserve a data value. As used herein, the shutdown mode refers to a state in which one or more source nodes of one or more transistors are connected to one or more body nodes of the one or more transistors and where a shutdown voltage (e.g., a floating voltage) is received at the one or more source nodes and the one or more body nodes. As a result, in some embodiments, a junction leakage between the one or more source nodes and the one or more body nodes is reduced.

Turning now to FIG. 2, a block diagram illustrating components of one embodiment of bit-cell voltage control system 100 controlling voltages of body nodes of bit-cell circuit 102 are shown. In the illustrated embodiment, bit-cell circuit 102 includes bit line 220, transistors 222-232, and bit line bar 234 (labeled in FIG. 2 as Bit Line B, and referring to the complement of bit line 220). Transistor 224 includes source node 236 and body node 240. Transistor 228 includes source node 238 and body node 242. Bit-cell voltage circuit 104 includes voltage source 210, transistor 214, and diode 216. Body voltage control circuit 106 includes transistors 202 and 206 and voltage source 210 (e.g., a same voltage source used to supply bit-cell voltage circuit 104). Although a particular arrangement of circuit components is illustrated with respect to FIG. 2, other functionally similar arrangements of circuits (e.g., using transmission gates instead of single transistors or only using active-low transistors (e.g., p-channel metal-oxide-semiconductor field-effect transistors (PMOS))) are contemplated. Although the illustrated embodiment includes voltage source 210, in other embodiments, voltage is received from one or more other circuits (e.g., one or more circuits external to bit-cell voltage control system 100). Additionally, in some embodiments, bit-cell voltage circuit 104 and body voltage control circuit 106 are connected to different voltage sources.

As described above, bit-cell voltage circuit 104 may output an operating voltage, a retention voltage, or a shutdown voltage. In particular, in the illustrated embodiment, in response to receiving wake signal 212 at transistor 214, transistor 214 may provide the operating voltage from voltage source 210 to source nodes 236 and 238 via node 108. Additionally, diode 216 may be configured such that diode 216 provides a sufficient amount of resistance to voltage received from voltage source 210 to output the retention voltage (as opposed to the operating voltage) to source nodes 236 and 238 via node 108. In the illustrated embodiment, the retention voltage is smaller than the operating voltage. Accordingly, in the illustrated embodiment, diode 216 outputs the retention voltage to node 108 whenever node 108 has a voltage value lower than the retention voltage (e.g., when transistor 214 is not providing the operating voltage to node 108). Accordingly, as further described below with respect to FIG. 3, bit-cell voltage circuit 104 receiving wake signal 212 may indicate a request for bit-cell circuit 102 to enter the active mode. However, in other embodiments, diode 216 may output the retention voltage in response to a signal that indicates a request to output the retention voltage. In some embodiments, bit-cell voltage circuit 104 may output the shutdown voltage by deactivating both transistor 214 and diode 216 (causing a floating voltage to be provided to node 108). In other embodiments, bit-cell voltage circuit 104 may output the shutdown voltage by connecting a floating voltage to node 108 using transistor 214, diode 216, or both.

As described above, bit-cell circuit 102 may operate in various modes indicative of operations performed by bit-cell circuit 102. In at least some of the modes, bit-cell circuit 102 may perform one or more of receiving a data value for storage using one or more bit lines, storing the data value using a retention voltage, storing the data value using the operating voltage, or outputting the data value using the one or more bit lines. In particular, in the illustrated embodiment, bit-cell circuit 102 includes six transistors (transistors 222-232) arranged in a six transistor memory cell, including cross-coupled inverters formed by transistors 224 and 226 and by transistors 228 and 230, respectively. In some embodiments, bit-cell circuit 102 may be a static random access memory (SRAM) bit-cell. The retention voltage received from bit-cell voltage circuit 104 via diode 216 may be sufficient to trigger transistors 224-230 such that a data value and an inverse of the data value may be stored. Similarly, the operating voltage may be sufficient to trigger transistors 224-230 such that the data value and the inverse of the data value may be stored. When bit-cell circuit 102 is in the active mode, transistor 222 may, in response to word line signal 218, connect the data value to bit line 220. Similarly, transistor 232 may, in response to word line signal 218, connect an inverted version of the data value to bit line bar 234.

As described above, body voltage control circuit 106 may provide various voltages to one or more body nodes (e.g., body nodes 240 and 242) based on the mode of bit-cell circuit 102. As further described below with reference to FIG. 3, in the illustrated embodiment, body voltage control circuit 106 may, in response to second control signal 208, provide the operating voltage to body nodes 240 and 242 by connecting body nodes 240 and 242 to voltage source 210 when bit-cell circuit 102 is in the active mode or the standby mode. Body voltage control circuit 106 may, in response to first control signal 204, provide a voltage from node 108 to body nodes 240 and 242 when bit-cell circuit 102 is in the sleep mode or the shutdown mode. As a result, in the illustrated embodiment, when bit-cell circuit 102 is in the sleep mode, body nodes 240 and 242 receive the retention voltage from bit-cell voltage circuit 102. Further, in the illustrated embodiment, when bit-cell circuit 102 is in the shutdown mode, body nodes 240 and 242 receive the shutdown voltage. Further, when transistor 202 is active, source nodes 236 and 238 of transistors 224 and 228 may be connected to body nodes 240 and 242 (e.g., such that transistors 224 and 228 are effectively zero body biased). Accordingly, a junction leakage between source node 236 and body node 240 may be reduced, as compared to a system where source node 236 and body node 240 receive different voltages. Similarly, a junction leakage between source node 238 and body node 242 may be reduced.

As described above, the illustrated embodiments show modifications of voltages of active-low transistors (e.g., with PMOS technology). In other embodiments (now shown), voltages of one or more active-high transistors (e.g., n-channel metal-oxide-semiconductor field-effect transistors (NMOS)) may be modified using techniques based on those described with reference to PMOS transistors. For example, transistors 226 and 230 may be connected to a Vss voltage (a voltage source that provides a voltage smaller than the voltage from voltage source Vdd 210) that may be increased when bit-cell circuit 102 is in the sleep mode, the shutdown mode, or both. Accordingly, in some cases, an operating voltage provided to source nodes and body nodes of the NMOS transistors in the active mode may be smaller than a retention voltage provided to the source nodes and the body nodes in the sleep mode. Similarly, in the standby mode, the operating voltage provided to the body nodes of the NMOS transistors may be smaller than the retention voltage provided to the source nodes of the NMOS transistors. In various embodiments, similar to the description of PMOS transistors above, in the shutdown mode, the source nodes are connected to the body nodes. Accordingly, the present disclosure is not intended to be limited to circuits in which only voltages of active-low transistors are modified.

Although the illustrated embodiment shows body nodes 240 and 242 being controlled together by a single transistor 202, in other embodiments, various body nodes (e.g., including body nodes 240 and 242) of various transistors of bit-cell circuit 102 may be controlled separately. For example, in some embodiments, body voltage control circuit 106 may use a different transistor to connect body node 240 to node 108 than to connect body node 242 to node 108.

Figure 3:
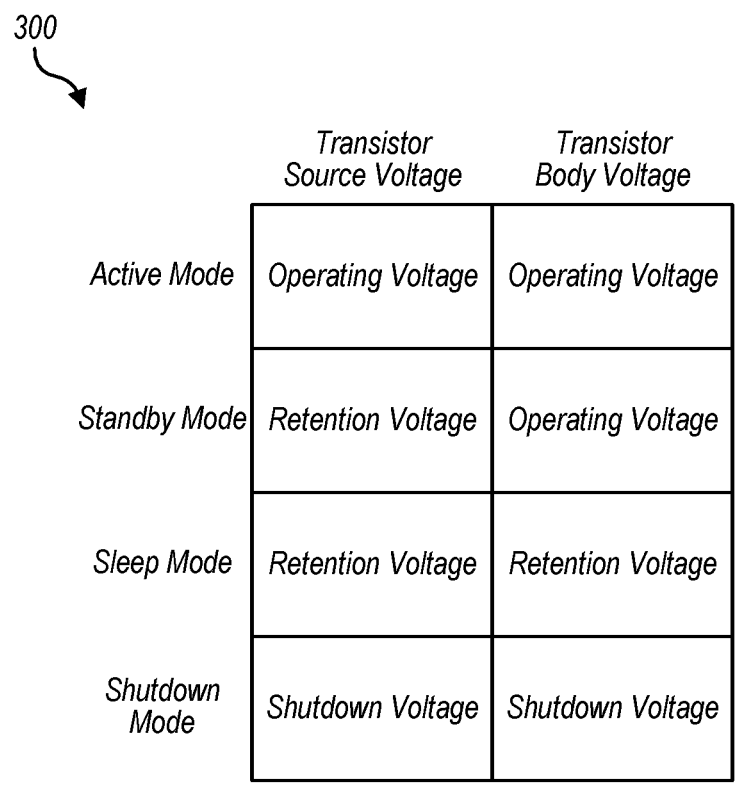
FIG. 3 is a block diagram illustrating an exemplary table listing exemplary voltage values provided to components of an exemplary bit-cell voltage control system in some embodiments.

Turning now to FIG. 3, a table 300 illustrating transistor source voltages and transistor body voltages provided to the bit-cell circuit described above with respect to FIG. 2 in various modes in one embodiment is shown. As noted previously, in other embodiments, the bit-cell circuit may not be configured to function in some of the modes illustrated by table 300, may be configured to function in one or more other modes not illustrated by table 300, or both.

As discussed above, in the illustrated embodiment, when bit-cell circuit 102 is in the active mode, one or more transistors (e.g., transistors 224 and 228) may receive the operating voltage at respective source nodes and body nodes. When bit-cell circuit 102 is in the standby mode, one or more transistors may receive the retention voltage at the respective source nodes and may receive the operating voltage at the respective body nodes. As a result, in some cases, a dynamic power consumption may be reduced, as compared to a system where the active mode is used in place of the standby mode. When bit-cell circuit 102 is in the sleep mode, one or more transistors may receive the retention voltage at the respective source nodes and may receive the retention voltage at the respective body nodes. As a result, in some cases, a junction leakage may be reduced, as compared to a system where the standby mode is used in place of the sleep mode. When bit-cell circuit 102 is in the shutdown mode, one or more transistors may receive the shutdown voltage at the respective source nodes and may receive the shutdown voltage at the respective body nodes. As a result, in some cases, a junction leakage may be reduced, as compared to a system where the transistor source voltage and the transistor body voltage differ in the shutdown mode.

Figure 4:
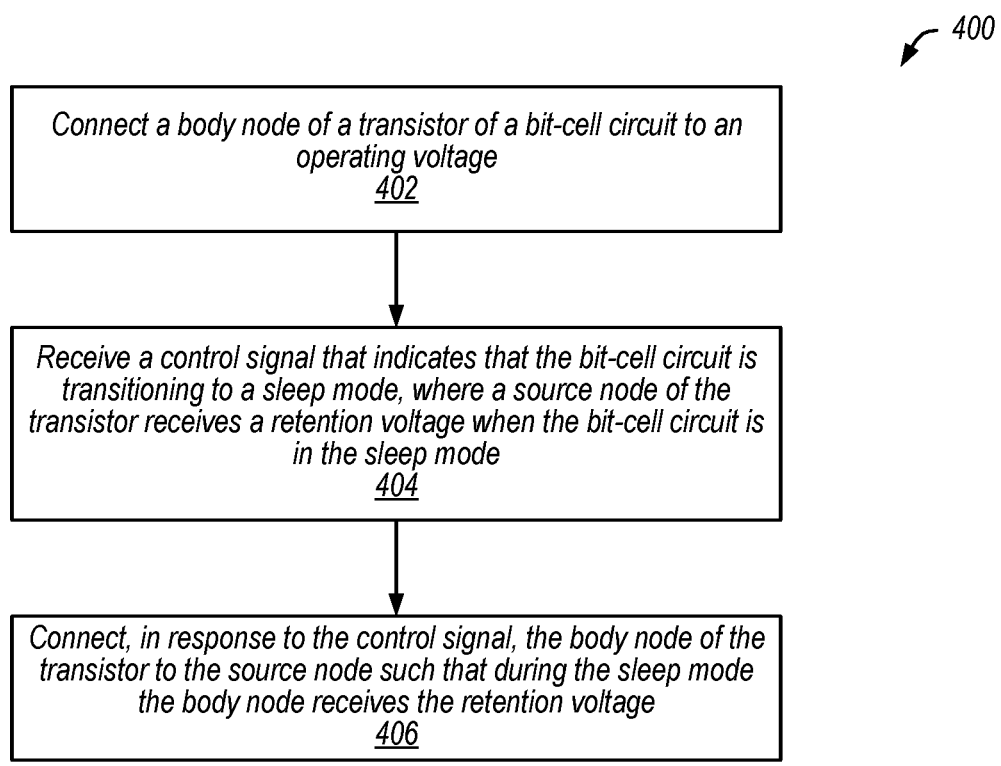
FIG. 4 is a flow diagram illustrating one embodiment of a method of controlling a body voltage of a bit-cell circuit.

Referring now to FIG. 4, a flow diagram of a method 400 is depicted. Method 400 is an embodiment of a method of controlling a body voltage of a bit-cell circuit. In some embodiments, method 400 may be initiated or performed by one or more processors in response to one or more instructions stored by a computer-readable storage medium.

At 402, method 400 includes connecting a body node of a transistor of a bit-cell circuit to an operating voltage. For example, method 400 may include body voltage control circuit 106 of FIG. 2 connecting, using transistor 206, body node 240 to voltage source 210.

At 404, method 400 includes receiving a control signal that indicates that the bit-cell circuit is transitioning to a sleep mode, where a source node of the transistor receives a retention voltage when the bit-cell circuit is in the sleep mode. For example, method 400 may include body voltage control circuit 106 receiving first control signal 204, where first control signal 204 indicates a transition to the sleep mode. Source node 236 may be connected to the retention voltage from diode 216. In some embodiments, the control signal may correspond to both first control signal 204 and second control signal 208.

At 406, method 400 includes connecting, in response to the control signal, the body node of the transistor to the source node such that during the sleep mode the body node receives the retention voltage. For example, method 400 may include body voltage control circuit 106 connecting, using transistor 202, body node 240 to source node 236. Accordingly, a method of controlling a body voltage of a bit-cell circuit is depicted.

Figure 5:
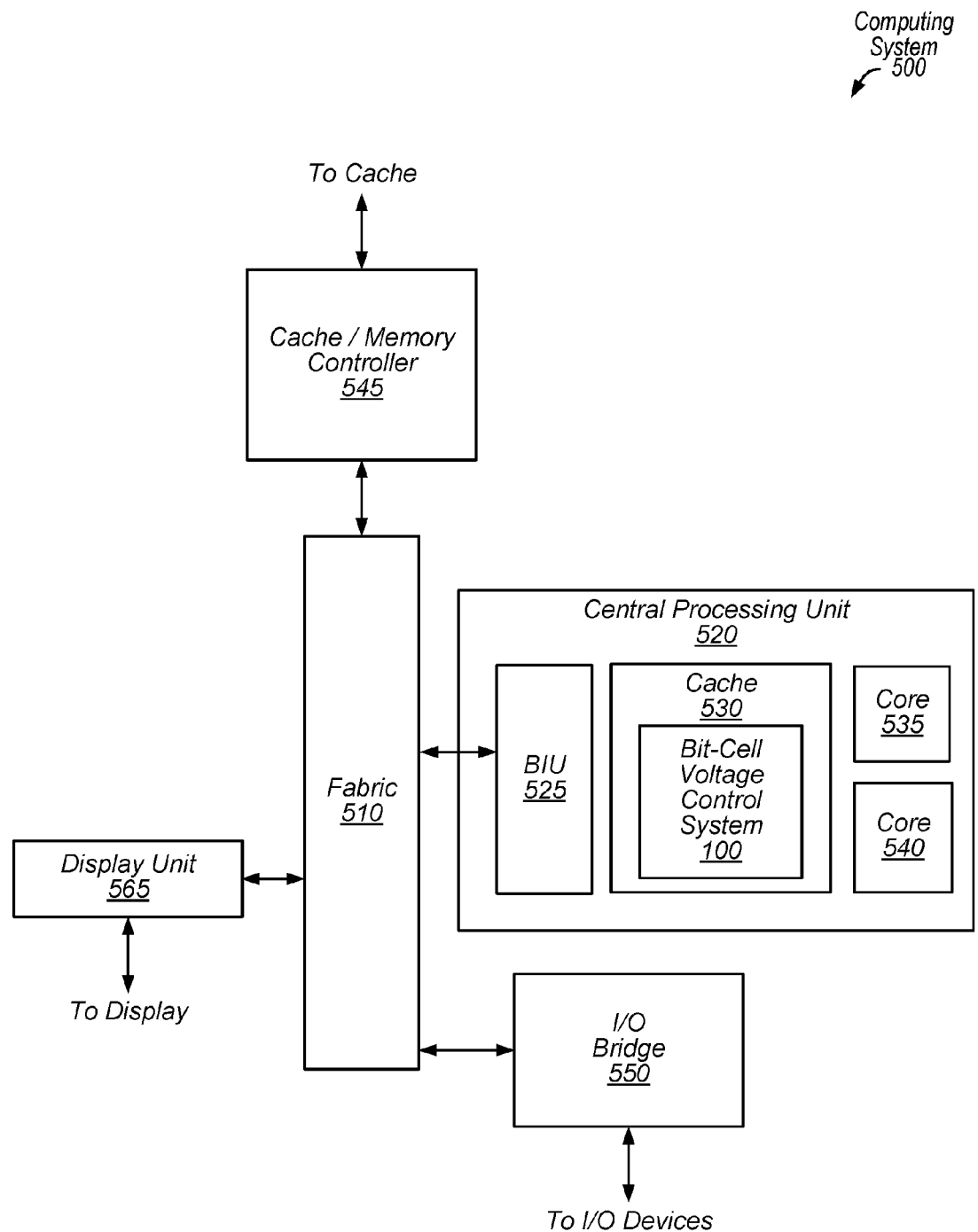
FIG. 5 is block diagram illustrating an embodiment of an exemplary computing system that includes at least a portion of an exemplary bit-cell voltage control system.

Turning next to FIG. 5, a block diagram illustrating an exemplary embodiment of a computing system 500 that includes at least a portion of an exemplary bit-cell voltage control system. Computing system 500 may include various circuits described above with reference to FIGS. 1-4. Computing system 500 may further include any variations or modifications described previously with reference to FIGS. 1-4. In some embodiments, some or all elements of the computing system 500 may be included within a system on a chip (SoC). In some embodiments, computing system 500 is included in a mobile device. Accordingly, in at least some embodiments, area, timing, and power consumption of computing system 500 may be important design considerations. In the illustrated embodiment, computing system 500 includes fabric 510, central processing unit (CPU) 520, input/output (I/O) bridge 550, cache/memory controller 545, and display unit 565. Although the computing system 500 illustrates central processing unit 520 as being connected to fabric 510 as a sole central processing unit of the computing system 500, in other embodiments, central processing unit 520 may be connected to or included in other components of the computing system 500 and other central processing units may be present. Additionally or alternatively, the computing system 500 may include multiple central processing units 520. The multiple central processing units 520 may correspond to different embodiments or to the same embodiment.

Fabric 510 may include various interconnects, buses, MUXes, controllers, etc., and may be configured to facilitate communication between various elements of computing system 500. In some embodiments, portions of fabric 510 are configured to implement various different communication protocols. In other embodiments, fabric 510 implements a single communication protocol and elements coupled to fabric 510 may convert from the single communication protocol to other communication protocols internally.

In the illustrated embodiment, central processing unit 520 includes bus interface unit (BIU) 525, cache 530, and cores 535 and 540. Cache 530 includes bit-cell voltage control system 100, which may correspond to any of the embodiments described above with reference to FIGS. 1-4. In various embodiments, central processing unit 520 includes various numbers of cores and/or caches. For example, central processing unit 520 may include 1, 2, or 4 processor cores, or any other suitable number. In some embodiments, cores 535 and/or 540 include internal instruction and/or data caches. In some embodiments, a coherency unit (not shown) in fabric 510, cache 530, or elsewhere in computing system 500 is configured to maintain coherency between various caches of computing system 500. BIU 525 may be configured to manage communication between central processing unit 520 and other elements of computing system 500. Processor cores 535 and 540 may be configured to execute instructions of a particular instruction set architecture (ISA), which may include operating system instructions and user application instructions. Although computing system 500 illustrates only a single instance of bit-cell voltage control system 100 located within cache 530, in other embodiments, bit-cell voltage control system 100 may be located elsewhere (e.g., within a cache attached to cache/memory controller 545) or in multiple locations.

Cache/memory controller 545 may be configured to manage transfer of data between fabric 510 and one or more caches and/or memories (e.g., non-transitory computer readable mediums). For example, cache/memory controller 545 may be coupled to an L3 cache, which may, in turn, be coupled to a system memory. In other embodiments, cache/memory controller 545 is directly coupled to a memory. In some embodiments, the cache/memory controller 545 includes one or more internal caches. In some embodiments, the cache/memory controller 545 may include or be coupled to one or more caches and/or memories that include instructions that, when executed by one or more processors, cause the processor, processors, or cores to initiate or perform some or all of the processes described above with reference to FIGS. 1-4. As noted above, one or more of the caches may include bit-cell voltage control system 100.

As used herein, the term "coupled to" may indicate one or more connections between elements, and a coupling may include intervening elements. For example, in FIG. 5, display unit 565 may be described as "coupled to" central processing unit 520 through fabric 510. In contrast, in the illustrated embodiment of FIG. 5, display unit 565 is "directly coupled" to fabric 510 because there are no intervening elements.

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display).

I/O bridge 550 may include various elements configured to implement: universal serial bus (USB) communications, security, audio, and/or low-power always-on functionality, for example. I/O bridge 550 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 500 via I/O bridge 550. In some embodiments, central processing unit 520 may be coupled to computing system 500 via I/O bridge 550.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a bit-cell circuit comprising one or more transistors, wherein the bit-cell circuit is configured to operate in a sleep mode and an active mode,
        wherein, during the sleep mode, the bit-cell circuit is configured to receive, via one or more source nodes of the one or more transistors, a retention voltage, and
        wherein, during the active mode, the bit-cell circuit is configured to receive, via the one or more source nodes, an operating voltage; and
    a body voltage control circuit, comprising:
        a first transistor configured to connect one or more body nodes of the one or more transistors of the bit-cell circuit to the one or more source nodes of the one or more transistors of the bit-cell circuit such that during the sleep mode, the one or more body nodes receive the retention voltage; and
        a second transistor configured to connect the one or more body nodes of the one or more transistors of the bit-cell circuit to a voltage source such that during the active mode, the one or more body nodes receive the operating voltage.

2. The apparatus of claim 1, wherein, during a standby mode:
    the bit-cell circuit is configured to receive, via the one or more source nodes, the retention voltage, and wherein, during the standby mode, the bit-cell circuit is not configured to output a data value; and
    the second transistor is configured to connect the one or more body nodes of the one or more transistors of the bit-cell circuit to the voltage source such that during the standby mode, the one or more body nodes receive the operating voltage.

3. The apparatus of claim 2, wherein the bit-cell circuit is configured to switch from the standby mode to the active mode in response to an indication of a read operation at the bit-cell circuit or in response to an indication of a write operation at the bit-cell circuit.

4. The apparatus of claim 1, wherein, the active mode corresponds to a read at the bit-cell circuit, and wherein, during the active mode, the bit-cell circuit is configured to output a data value stored at the bit-cell circuit using the operating voltage.

5. The apparatus of claim 1, wherein, during the sleep mode, the bit-cell circuit is configured to store a data value using the retention voltage.

6. The apparatus of claim 1, wherein the one or more transistors are active-low transistors.

7. The apparatus of claim 6, wherein the one or more transistors are p-type metal-oxide-semiconductor field effect transistors (PMOS).

8. The apparatus of claim 6, wherein the operating voltage is larger than the retention voltage.

9. The apparatus of claim 1, wherein the bit-cell circuit is a six-transistor static random access memory (SRAM) bit-cell.

10. The apparatus of claim 1, wherein, during a shutdown mode, the bit-cell circuit is configured to receive, via the one or more source nodes, a shutdown voltage, and wherein, during the shutdown mode, the first transistor is configured to connect the one or more body nodes of the one or more transistors of the bit-cell circuit to the one or more source nodes of the one or more transistors of the bit-cell circuit such that during the shutdown mode, the one or more body nodes receive the shutdown voltage.

11. The apparatus of claim 10, wherein the shutdown voltage is a floating voltage.

12. The apparatus of claim 1, wherein the body voltage control circuit is associated with a plurality of bit-cell circuits including the bit-cell circuit.

13. The apparatus of claim 1, further comprising a bit-cell voltage circuit configured, in response to a wake signal, to output the operating voltage to the bit-cell circuit.

14. The apparatus of claim 13, wherein the bit-cell voltage circuit comprises a diode configured to provide the retention voltage to the bit-cell circuit.

15. A method, comprising:
- connecting, by a body voltage control circuit, a body node of a transistor of a bit-cell circuit to an operating voltage;
- receiving, at the body voltage control circuit, a control signal that indicates that the bit-cell circuit is transitioning to a sleep mode, wherein a source node of the transistor receives a retention voltage when the bit-cell circuit is in the sleep mode; and
- connecting, by the body voltage control circuit in response to the control signal, the body node of the transistor to the source node such that during the sleep mode, the body node receives the retention voltage.

16. The method of claim 15, wherein the operating voltage is larger than the retention voltage, and wherein the transistor is a p-type metal-oxide-semiconductor field effect transistors (PMOS).

17. The method of claim 15, wherein the operating voltage is smaller than the retention voltage, and wherein the transistor is an n-type metal-oxide-semiconductor field effect transistors (NMOS).

18. A non-transitory computer readable storage medium having stored thereon design information that specifies a circuit design in a format recognized by a fabrication system that is configured to use the design information to fabricate a hardware integrated circuit that includes circuitry configured to operate according to the circuit design, wherein the circuitry includes:
- a bit-cell circuit comprising one or more transistors, wherein the bit-cell circuit is configured to operate in a sleep mode and an active mode,
  - wherein, during the sleep mode, the bit-cell circuit is configured to receive, via one or more source nodes of the one or more transistors, a retention voltage, and
  - wherein, during the active mode, the bit-cell circuit is configured to receive, via the one or more source nodes, an operating voltage; and
- a body voltage control circuit, comprising:
  - a first transistor configured to connect one or more body nodes of the one or more transistors of the bit-cell circuit to the one or more source nodes of the one or more transistors of the bit-cell circuit such that during the sleep mode, the one or more body nodes receive the retention voltage; and
  - a second transistor configured to connect the one or more body nodes of the one or more transistors of the bit-cell circuit to a voltage source such that during the active mode, the one or more body nodes receive the operating voltage.

19. The non-transitory computer readable storage medium of claim 18, wherein, during a standby mode, the bit-cell circuit is configured to receive, via the one or more source nodes, the retention voltage, and wherein, during the standby mode, the second transistor is configured to connect the one or more body nodes of the one or more transistors of the bit-cell circuit to the voltage source such that during the standby mode, the one or more body nodes receive the operating voltage.

20. The non-transitory computer readable storage medium of claim 18, wherein, during a shutdown mode, the bit-cell circuit is configured to receive, via the one or more source nodes, a shutdown voltage, and wherein, during the shutdown mode, the first transistor is configured to connect the one or more body nodes of the one or more transistors of the bit-cell circuit to the one or more source nodes of the one or more transistors of the bit-cell circuit such that during the shutdown mode, the one or more body nodes receive the shutdown voltage.

* * * * *